(12) United States Patent
Chen et al.

(10) Patent No.: US 7,158,425 B2
(45) Date of Patent: Jan. 2, 2007

(54) SYSTEM AND METHOD FOR PROVIDING A REDUNDANT MEMORY ARRAY IN A SEMICONDUCTOR MEMORY INTEGRATED CIRCUIT

(75) Inventors: Chao-Wu Chen, San Jose, CA (US); Richard Roy, Danville, CA (US); Wasim Khaled, Newark, CA (US)

(73) Assignee: Mosaic Systems, Inc., Los Altos, CA (US)

( * ) Notice: Subject to any disclaimer, the term of this patent is extended or adjusted under 35 U.S.C. 154(b) by 256 days.

(21) Appl. No.: 10/628,896

(22) Filed: Jul. 28, 2003

(65) Prior Publication Data
US 2005/0024912 A1    Feb. 3, 2005

(51) Int. Cl.
*G11C 7/00* (2006.01)

(52) U.S. Cl. ...................... 365/200; 365/191

(58) Field of Classification Search ........... 365/200, 365/191
See application file for complete search history.

(56) References Cited

U.S. PATENT DOCUMENTS 4,376,300 A * 3/1983 Tsang ................... 365/200
6,762,963 B1 * 7/2004 Inoue et al. ............ 365/200

* cited by examiner

*Primary Examiner*—Michael Tran
(74) *Attorney, Agent, or Firm*—Edward C. Kwok; MacPherson Kwok Chen & Heid LLP

(57) ABSTRACT

A memory device that has an internal memory array provides timing signals to control the output timing of one or more redundant memory blocks that substitute for defective memory blocks in the internal memory array. In one embodiment, the internal memory array includes a pipelined output stage, and the timing signals ensure that the data is output from the memory devices in the order memory access requests are issued, even when the latency of the redundant memory blocks is less than the latency of the main memory array by up to two clock periods. In one embodiment, a FIFO memory queues the output data of the redundant memory blocks waiting to be output.

16 Claims, 8 Drawing Sheets

SYSTEM AND METHOD FOR PROVIDING A REDUNDANT MEMORY ARRAY IN A SEMICONDUCTOR MEMORY INTEGRATED CIRCUIT

BACKGROUND OF THE INVENTION

1. Field of the Invention

The present invention relates to semiconductor memory circuits. In particular, the present invention relates to proper timing for semiconductor memory circuits with memory array redundancy.

2. Description of the Related Art

Because of their speed, static random access memory (SRAM) devices are semiconductor memory integrated circuits preferred in high performance applications, such as memory caches and table look-aside buffers for address translation. In these applications, to avoid memory accesses from becoming a bottleneck, SRAM devices are designed to operate at or close to the speed of the processor bus. Even though the actual latency of a read access—as measured between the time the address is ready to the time data output is ready—may be a few processor bus cycles, pipelining in SRAM devices has allowed these devices to maintain a high throughput, such as providing an output data word per processor cycle. (The term "word" refers to the width of the output data.)

As technology advances, SRAM devices have also reached correspondingly high circuit density. As the number of circuit elements fabricated on an integrated circuit increases, the probability of a defective circuit element existing on the integrated circuit also increases. To avoid a single defect from rendering the integrated circuit useless, designers can introduce a degree of fault-tolerance into the integrated circuit by including redundant circuits. Typically, when a defective circuit is detected in the integrated circuit during a testing step in the manufacturing process, configuring a redundant circuit to substitute for the defective circuit can repair the integrated circuit. In a memory circuit, such as an SRAM device, the redundant circuits can be additional blocks of the memory circuits that can be reconfigured to substitute for defective blocks in the main memory array.

The repaired integrated circuit should perform to specification, so that the user is not required to adjust for the repair. To achieve the fault-tolerance, designers pay an area penalty for the redundant circuits and the necessary accompanying control circuits. In a memory integrated circuit, such as an SRAM device, the number of normal blocks in the main memory array should far exceed the number of redundant blocks provided to minimize the percentage area penalty. As a result, the access time of a redundant block (i.e., its latency) can be significantly less than the access time of the block the main memory array it substitutes for. Thus, to ensure correct operation, the design must ensure that timing and the order of data output are correctly preserved in the repaired circuit.

SUMMARY OF THE INVENTION

A memory device that has a main memory array provides timing signals to control the output timing of one or more redundant memory blocks that substitute for defective memory blocks in the main memory array. The main memory array may include a pipelined output stage; the timing signals from the main memory array ensure that the data is output from the memory devices in the order the memory access requests are issued. A FIFO memory may be provided to queue the output data of the redundant memory blocks waiting to be output.

According to one embodiment of the present invention, a memory circuit includes a memory array, a redundant memory circuit and a selection circuit that places the desired output data onto an output data bus. The selection circuit selects the desired output data from either the memory array or the redundant memory circuit. In that embodiment, the memory array includes a control circuit that generates a timing signal which is asserted at a predetermined time relative to when the output data from the memory access to the memory array is expected to be ready at the output data bus. The redundant memory circuit provides its output data to the selection circuit according to the timing signal.

In one embodiment, the memory circuit also provides a second timing signal that indicates that the output data of the memory array is ready. The selection circuit can then provide the output data on the output data bus according to the second timing signal.

In one embodiment, the redundant memory circuit holds its output data in a first-in-first-out (FIFO) memory. The FIFO memory can be controlled using the timing signal received from the memory array. In one embodiment, the FIFO memory includes one or more toggle flip-flops that control two or more registers receiving output data from redundant memory blocks in an orderly fashion. One or more toggle flip-flops can also be used to control output timing according to the timing signal received from the memory array.

The methods embodied in the embodiments described herein are also within the scope of the present invention. The present invention is better understood upon consideration of the detailed description below and the accompanying drawings.

BRIEF DESCRIPTION OF THE DRAWINGS

as shown in FIG. 6, memory block 600 can be organized as four 4K×16 memory blocks 605a–605d.

as shown in FIG. 7, memory block 700 can be organized as four 1K×16 memory blocks 705a–705d.

as shown in FIG. 8, memory block 800 can be organized in 128 rows and 128 columns.

To help the identify corresponding elements in these figures, like elements in the figures are provided like reference numerals.

DETAILED DESCRIPTION OF THE PREFERRED EMBODIMENTS

Figure 1:
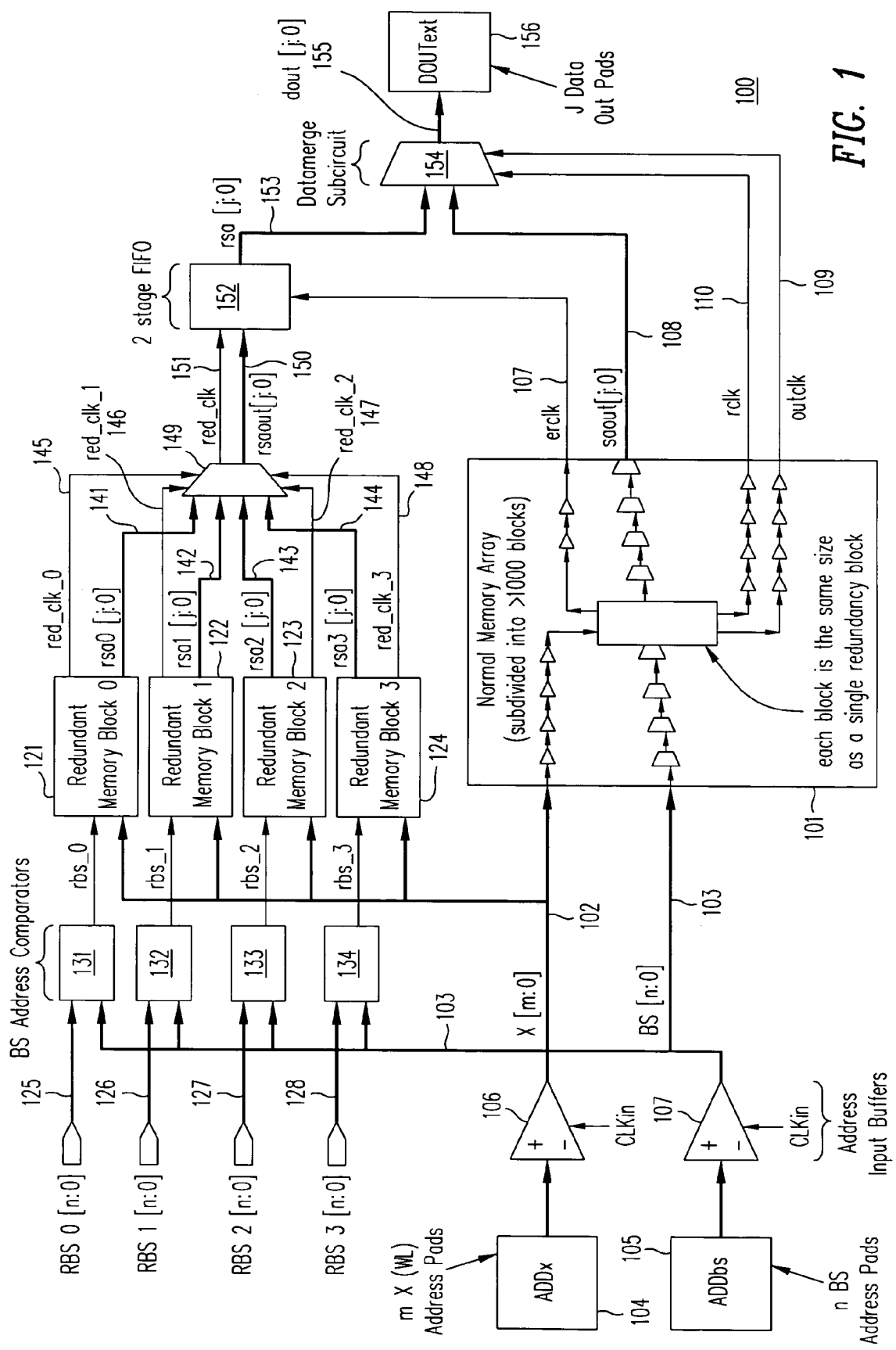
FIG. 1 shows memory circuit 100, according to one embodiment of the present invention.

The present invention provides a memory device with redundant memory blocks that can be configured to substitute for defective blocks in the main memory array with correct timing and correct order of data output. FIG. 1 shows memory circuit 100, according to one embodiment of the present invention.

As shown in FIG. 1, memory circuit 100 includes main memory array 101 and redundant blocks 121–124. Main memory array 101 includes an array of numerous conventional memory blocks (e.g., 1024), each of which includes conventional column and row decoders, and conventional sense amplifiers and output circuits. (Of course, the number of memory blocks in main memory array 101 and the number of redundant blocks shown herein are merely illustrative; the present invention is applicable to any number of memory blocks in the main memory array and any number of redundant memory blocks.) Main memory array 101, which is pipelined to enhance throughput, receives an (m+1)-bit "X" address X[m:0] on address bus segment 102, and an (n+1)-bit "block select" or "BS" address BS[n:0] on address bus segment 103. The BS address selects one out of the total number of blocks within memory array 101. The so-called X address selects an individual row and an individual set of columns within the selected block selected by the BS address. The number of columns in the set typically equals the number of the selected sense amplifiers. The X and BS addresses are latched into memory circuit 100 by address input buffer circuits 106 and 107 from input pads 104 and 105, respectively. The normal output data (i.e., the output data from memory blocks that are not substituted by redundant memory blocks) is provided as (j+1)-bit output data saout[j:0] at memory output bus 108. For each read from a memory block within main memory array 101, main memory array 101 provides the output data on bus saout[j:0] 108 and a data ready pulse outclk at control terminal 109. A control circuit within a memory block (for example, control circuit 802 within memory block 800, shown in FIG. 8 and discussed in further detail below) detects an attempted read access to a defective block (i.e., a memory block that is substituted by a redundant memory block). As discussed in further detail below, when the redundant memory block control circuit detects a read access to a defective block, a redundant output ready pulse rclk is provided at terminal 110 at the time when data ready pulse outclk would have been provided at control terminal 109 when output data is ready from the read access. Further, the control circuit provides an early version of data ready pulse rclk as a control pulse ("erclk") at control terminal 111. These signals will be discussed in further detail below.

During a testing step in the manufacturing process, when a defective memory block in main memory array 101 is detected, one of redundant memory blocks 121–124 is selected to substitute for the defective memory block by programming the BS address of the defective memory block in a non-volatile manner into memory circuit 100. Such programming can be achieved, for example, by writing into a register or a set of fuses or anti-fuses associated with the selected redundant memory block. In FIG. 1, signals RBS_0[n:0], RBS_1[n:0], RBS_2[n:0] and RBS_3[n:0] on signal buses 125–128, respectively, represent the programmed BS addresses that select redundant memory blocks 121–124. BS address comparators 131–134, each comparing one of the programmed BS addresses with the BS address on address bus segment 103, assert a corresponding one of control signals rbs_0, rbs_1, rbs_2 and rbs_3 at terminals 135–138 when a match is detected (i.e., when one of the redundant blocks is to be used, rather than the defective memory block in main memory array 101). Each of control signals rbs_0, rbs_1, rbs_2 and rbs_3 selects one of corresponding redundant memory blocks 121–124. When one of control signals rbs_0, rbs_1, rbs_2 and rbs_3 is asserted, the selected redundant memory block latches the X address of the read access from address bus segment 102, carries out the requested memory access, and provides the data read as the corresponding output data rsa0[j:0], rsa1[j:0], rsa2[j:0] or rsa3[j:0] on one of data buses 141–144. Data ready on any one of buses 141–144 is indicated by a corresponding ready pulse red_clk_0, red_clk_1, red_clk_2, or red_clk_3, asserted on the corresponding control terminal 145, 146, 147 or 148. The ready pulse red_clk_0, red_clk_1, red_clk_2, or red_clk_clk_3 causes selection circuit 149 to latch the corresponding output data rsa0[j:0], rsa1[j:0], rsa2[j:0] or rsa3[j:0] on data buses 141–144 as output data rsaout[j:0] on data bus 150, and to provide data ready pulse red_clk at control terminal 151.

In the embodiment shown in FIG. 1, first-in-first-out (FIFO) memory 152 is provided to hold the output data rsaout[j:0] from data bus 150 in an orderly fashion. One exemplary implementation of FIFO memory 152 is provided as two-stage FIFO memory circuit 200 in FIG. 2, and discussed below in further detail. The output data rsa[j:0] on output bus 153 from FIFO memory 152 is thus the output data from redundant memory blocks 121–124 synchronized to be available at the same time as the data on bus 108 (i.e., data saout[j:0]) would be available if the defective block in main memory array 101 had been accessed in the normal course. Depending on which one of data ready pulses outclk and rclk is asserted, selection circuit 154 selects the corresponding data rsa[j:0] or saout[j:0] as output data dout[j:0] on data output bus 155 of memory circuit 100. The early version erclk of data ready pulse rclk is asserted ahead of ready pulse rclk, so that data rsa[j:0] from accessing the redundant memory block is available and ready on output bus 153 when data ready pulse rclk is asserted. Output data dout[j:0] on data output bus 155 can be driven off-chip via data output pads 156. One exemplary implementation of selection circuit 154 is shown as selection circuit 300 in FIG. 3 and discussed in further detail below.

Figure 2:
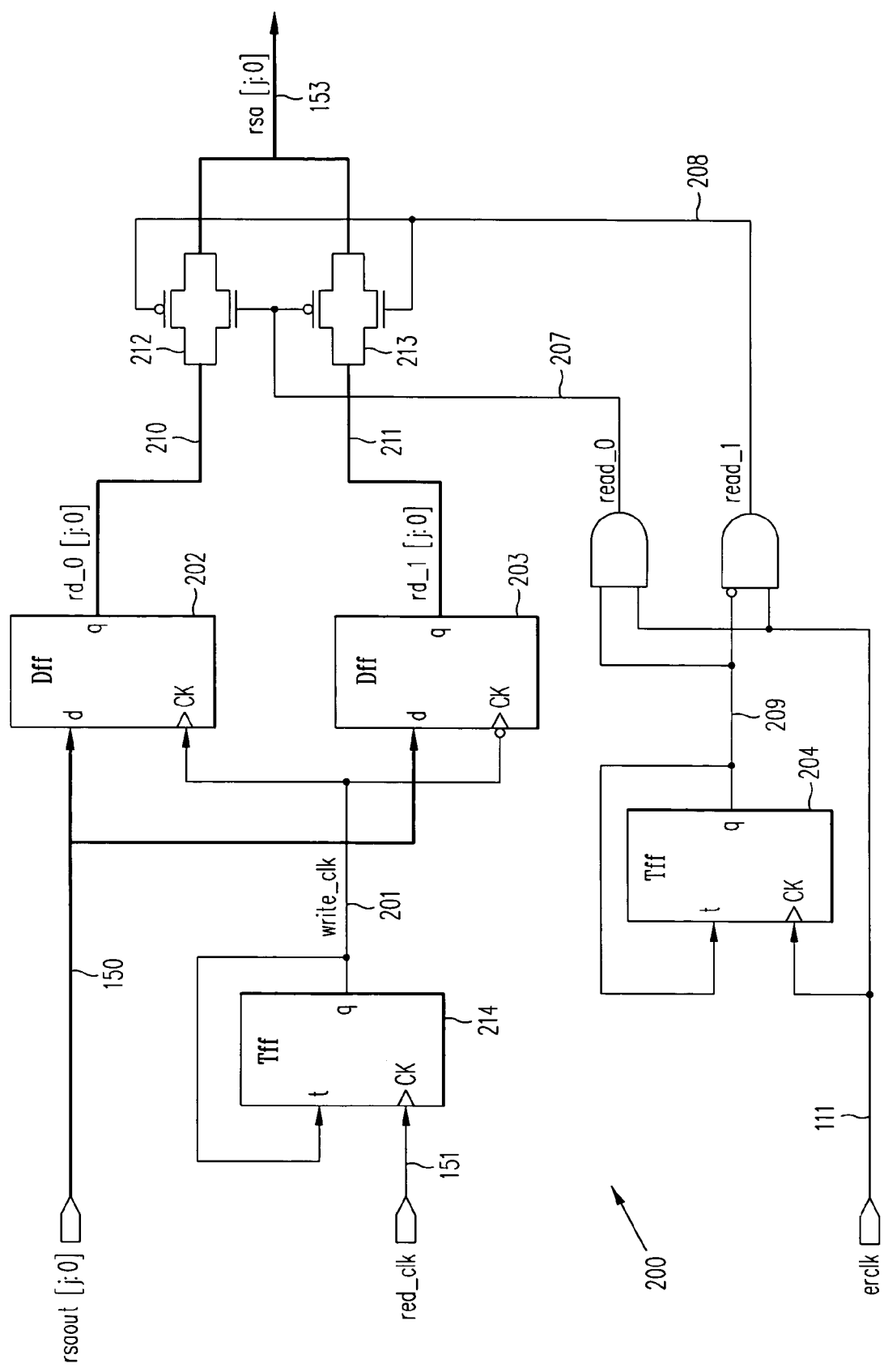
FIG. 2 shows FIFO memory circuit 200 which can be used to implement FIFO memory 152 of FIG. 1.

As shown in FIG. 2, two-stage FIFO memory circuit 200, which can implement FIFO memory 152 of FIG. 1, receives output data rsaout[j:0] on data bus 150 from selection circuit 149 (FIG. 1), data ready pulse red_clk at control terminal 151, and control pulse erclk at control terminal 111 from main memory array 101. Whenever data ready pulse red_clk is asserted, toggle flip-flop ("TFF") 214 changes the state of its output signal write_clk at terminal 201, which is used as clock input to data registers 202 and 203. Data registers 202 and 203 respond to complementary state transitions of signal write_clk, so that, at successive data ready pulses red_clk, the data rsaout[j:0] on data bus 150 is alternately latched into registers 202 and 203, and provided as output data rd_0[j:0] and rd_1[j:0] on data buses 210 and 211, respectively.

TFF 204 responds to control pulse erclk and changes the state of its output signal at terminal 209. Logic gates 205 and 206 both receive the output signal at terminal 209 and alternately assert selection signals read_0 and read_1 at terminals 207 and 208, respectively. Selection signals 207 and 208 control transfer gates 212, and 213, respectively, and alternately transfer output data rd_0[j:0] and rd_1[j:0] on data buses 210 and 211 through transfer gates 212 and 213 to data bus 153 as output data rsa[j:0]. Thus, FIFO memory circuit 200 queues the successive data on data bus 150 according to data ready pulses red_clk at terminal 151, and provides the queued data as output data rsa[j:0] in FIFO order to output bus 153, according to the timing of control pulses erclk at control terminal 111.

Figure 3:
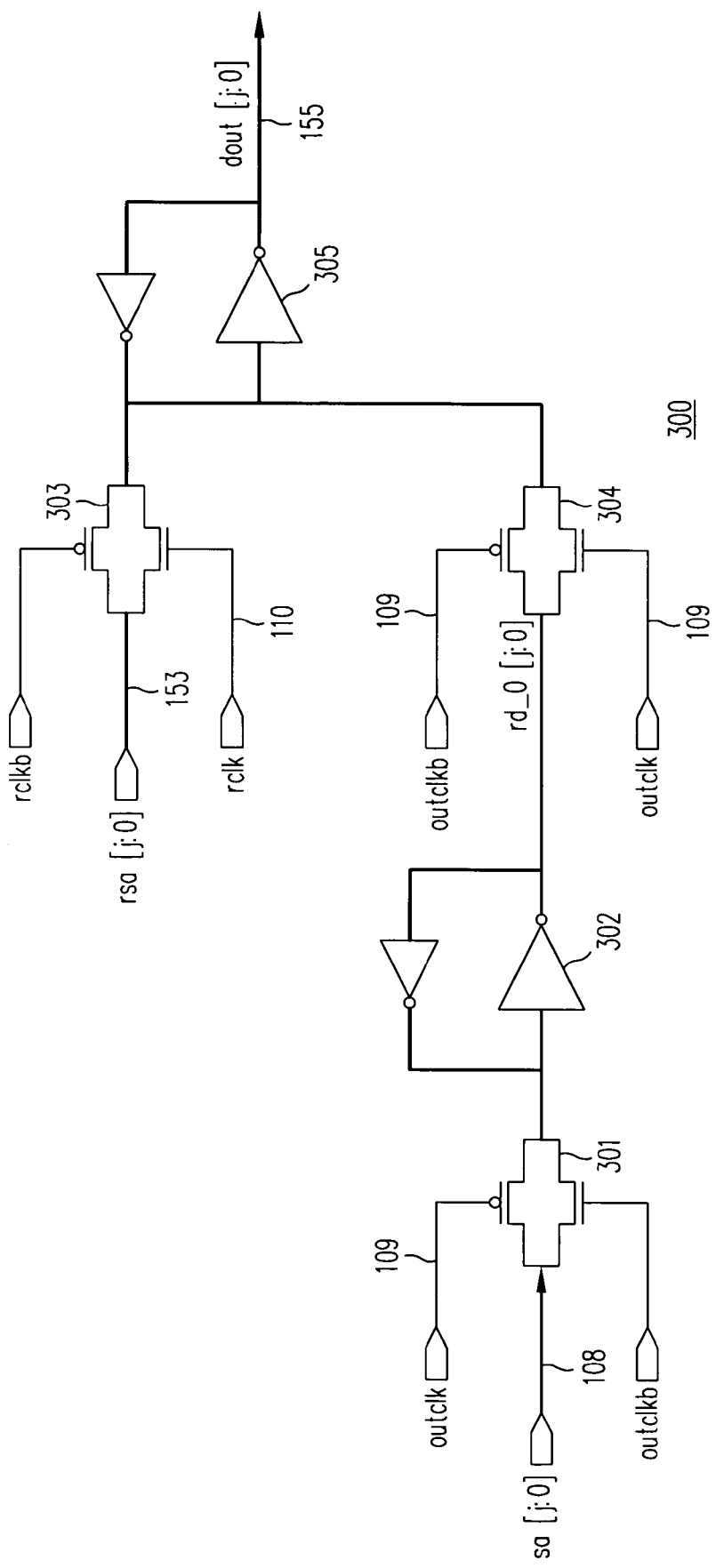
FIG. 3 shows selection circuit 300 which can be used to implement selection circuit 154 of FIG. 1.
Figure 4:
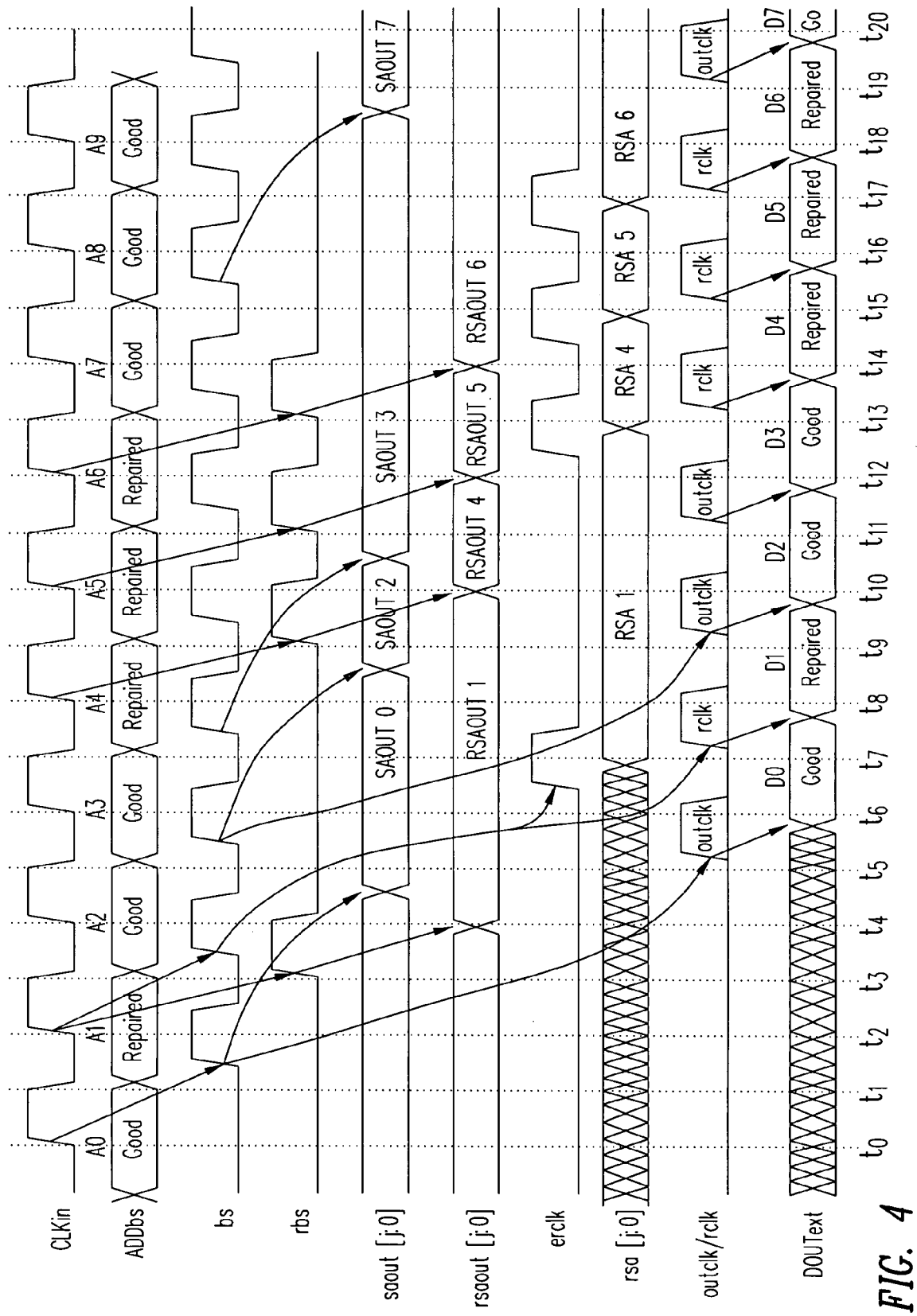
FIG. 4 shows various waveforms of signals in memory circuit 100 during ten read accesses using addresses A0–A9, in accordance with one embodiment of the present invention.
Figure 5:
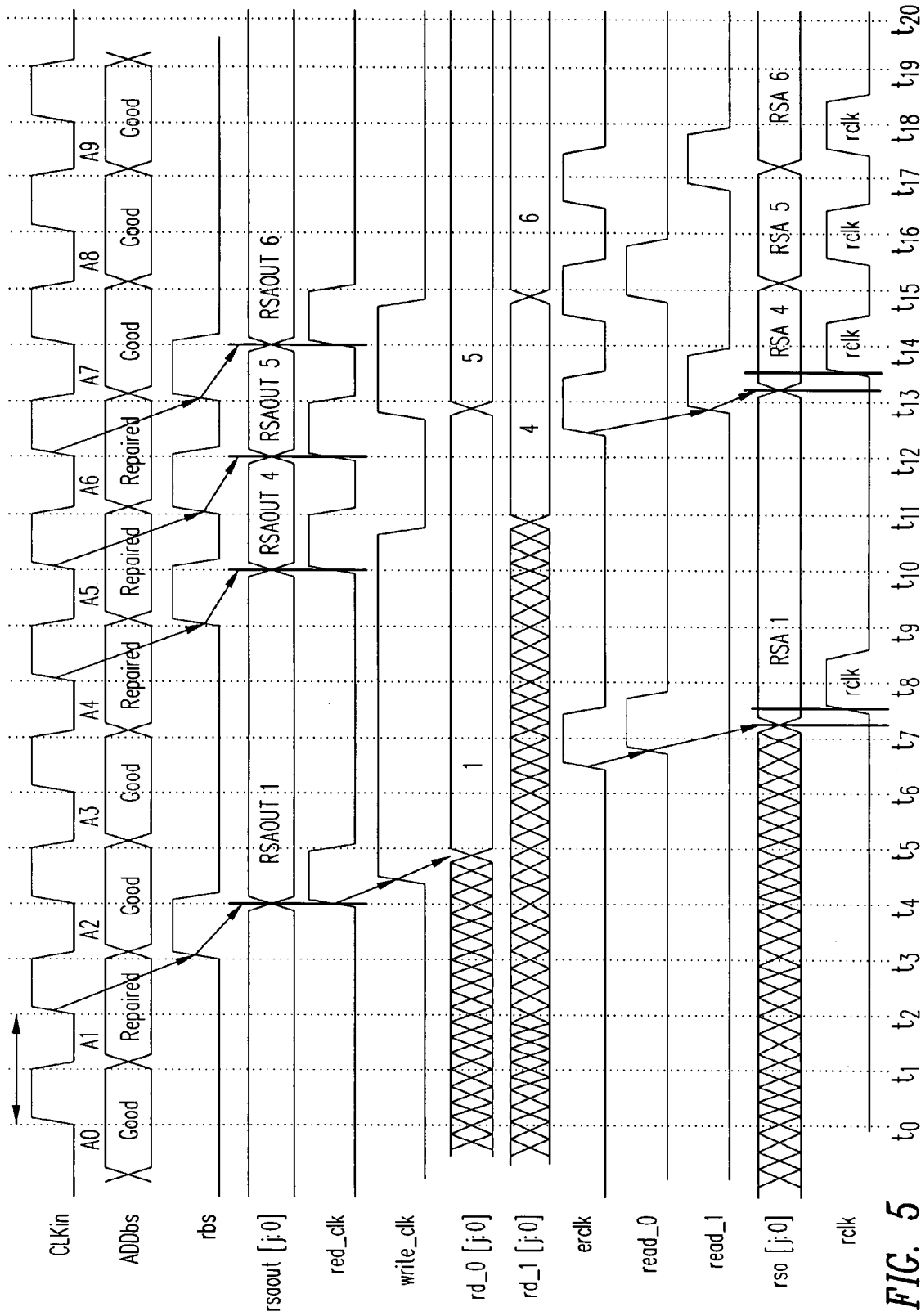
FIG. 5 shows various waveforms related to redundant memory blocks 121–124 during the same ten read accesses of FIG. 4.

As shown in FIG. 3, selection circuit 300, which can implement selection circuit 154 of FIG. 1, receives output data saout[j:0] of main memory array 101 on data bus 108, output data rsa[j:0] from FIFO memory 152 on data bus 153, and their respective data ready pulses outclk and rclk at control terminals 109 and 110, respectively. When data ready pulse outclk is received, the received data saout[j:0] on data bus 153 is written into latch 302. At the occurrence of either the next data ready pulse outclk or data ready rclk, whichever is earlier, either the data stored,in register 302 or output data rsa[j:0] on data bus 153 is written into latch 305. The output of register 305 is provided as output data dout[j:0] on data bus 155. Read accesses in memory circuit 100 according to the present invention are best illustrated by example, using the timing diagrams of FIGS. 4 and 5. FIG. 4 shows various waveforms of signals in memory circuit 100 during ten read accesses to memory circuit 100 using addresses A0–A9, according to one embodiment of the present invention. FIG. 5 shows waveforms related to redundant memory blocks 121–124 during the same ten read accesses of FIG. 4. As shown in FIG. 4, addresses A0 to. A9 are provided successively on address pads 104 and 105 at every cycle of clock signal CLKin. In this embodiment, clock signal CLKin has a period of 1 nanosecond (i.e., operating at 1 GHz). Address input buffers 106 and 107 sample the addresses at times $t_0, t_2, \ldots, t18$ and provide them on address bus segments 102 and 103 after an approximate latency of 0.7 clock cycles. (Signal BS in FIG. 4 represents appearance of valid address signals on address bus segments 102 and 103).

In this example, addresses A1, A4–A6 correspond to addresses of memory blocks in main memory array 101 that are substituted by redundant memory blocks. Thus, as seen in FIG. 4, after a latency of 0.5 clock cycles from the arrivals of addresses A1, A4–A6, a match is indicated at address comparators 131–34 at each of times $t_3, t_9, t_{11}$ and $t_{13}$. (signal rbs in FIG. 4 indicates a pulse in any of control signals rbs_0, rbs_1, rbs_2 and rbs_3). Because of the relative complexities, redundant memory blocks typically have a much shorter latency than main memory array 101. Consequently, output data rsaout[j:0] (data bus 150) from read accesses of addresses A1, A4–A6 are provided at times $t_4$, $t_{10}, t_{12}$ and $t_{14}$, each being about 1 clock cycle after the corresponding read address is latched into memory circuit 100, as seen from the waveform of rsaout[j:0]. In contrast, as seen from waveform saout[j:0] (data bus 108), data output to main memory array 101, corresponding to addresses A0, A2–A3, are provided at times $t_5, t_9,$ and $t_{11}$. Thus, data output for accesses A0 is ready at data bus 150 later than data output ready for access A1, even though address A0 is provided earlier than addresses A1. To properly sequence data output dout[j:0] at output data bus 155, data ready pulses outclk (terminal 109) or rclk (terminal 110) are asserted every clock cycle, according to the present invention at times $t_5, t_7, \ldots, t_{19}$ to indicate data ready to selection circuit 154, so that data output dout[j:0] for accesses corresponding to addresses A0–A7 can be made ready for sampling at data bus 155 at times $t_6, t_8, \ldots, t_{20}$. Approximately half a clock cycle before data ready pulses rclk appear at times $t_7$ and $t_{13}$–$t_{17}$, erclk is asserted at terminal 111 to shift the latched data output from one of the redundant memory blocks out of two-stage FIFO memory 152 as data output rsa[j:0] onto data bus 153. Output data rsa[j:0] (data bus 153) corresponding to the various accesses to the redundant memory blocks is therefore ready for sampling by selection circuit 154, when redundant data ready pulses rclk are asserted at times $t_7$ and $t_{13}$–$t_{17}$.

FIG. 5 shows control signals related to accesses to redundant memory blocks 121–124 during the read accesses of FIG. 4. As shown in FIG. 5, when a match is indicated at address comparators 131–134 by one of signals rbs_0, rbs_1, rbs_2 and rbs3 at each of times $t_3, t_9, t_{11}$ and $t_{13}$, data ready pulses red_clk are asserted at times $t_4, t_{10}, t_{12}$ and $t_{14}$, indicating that output data rsaout[j:0] is available from data bus 150, as mentioned above and shown in FIG. 4. When data ready pulses red_clk are asserted at times $t_4, t_{10}, t_{12}$ and $t_{14}$, TFF 214 (FIG. 2) responds by toggling its output signal write_clk at control terminal 201 approximately 0.5 clock cycles later in each instance. As a result of the transitions of signal write_clk between times $t_4$ and $t_5$, $t_{10}$ and $t_{11}$, $t_{12}$ and $t_{13}$, and $t_{14}$ and $t_{15}$, output data rsaout[j:0] is latched alternatively from data bus 150 into registers 202 and 203 at times $t_5, t_{11}, t_{13}$ and $t_{15}$, as can be seen in FIG. 5 from the waveforms of data output rd_0[j:0] (data bus 210) and rd_1[j:0] (data bus 211). Control pulses erclk at control terminal 111 arriving after times $t_6, t_{12}, t_{14}$ and $t_{15}$ toggle output signal at terminal 209 of TFF 209. Consequently, complementary output signals read_0 (terminal 207) and read_1 (terminal 208) of logic gates 205 and 206 alternately transfer output data rd_0[j:0] and rd_1[j:1] as output data rsa[j:0] at data bus 153 at times $t_7, t_{13}, t_{15}$ and $t_{17}$; just prior to assertion of data ready pulses rclk in each instance. FIFO 152 allows the difference in latency between the normal memory access path and the redundant path to be up to two cycles.

Storing data into a memory cell in main memory array 101 or in redundant memory blocks 121–124 is achieved in a conventional manner.

Figure 6:
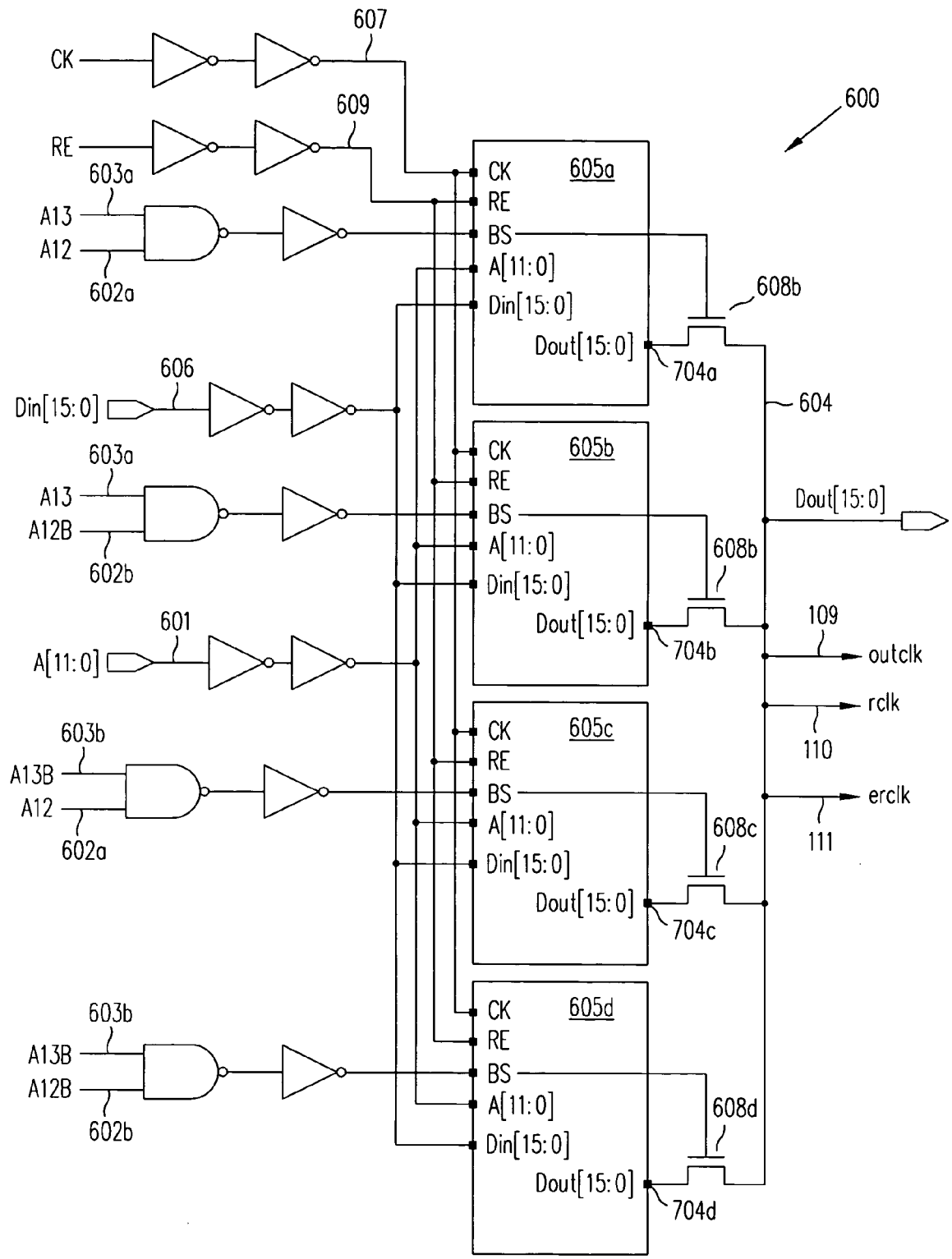
FIG. 6 illustrates 16K×16 memory block 600, which can be used to provide main memory array 101 of FIG. 1, in accordance with one embodiment of the present invention.
Figure 7:
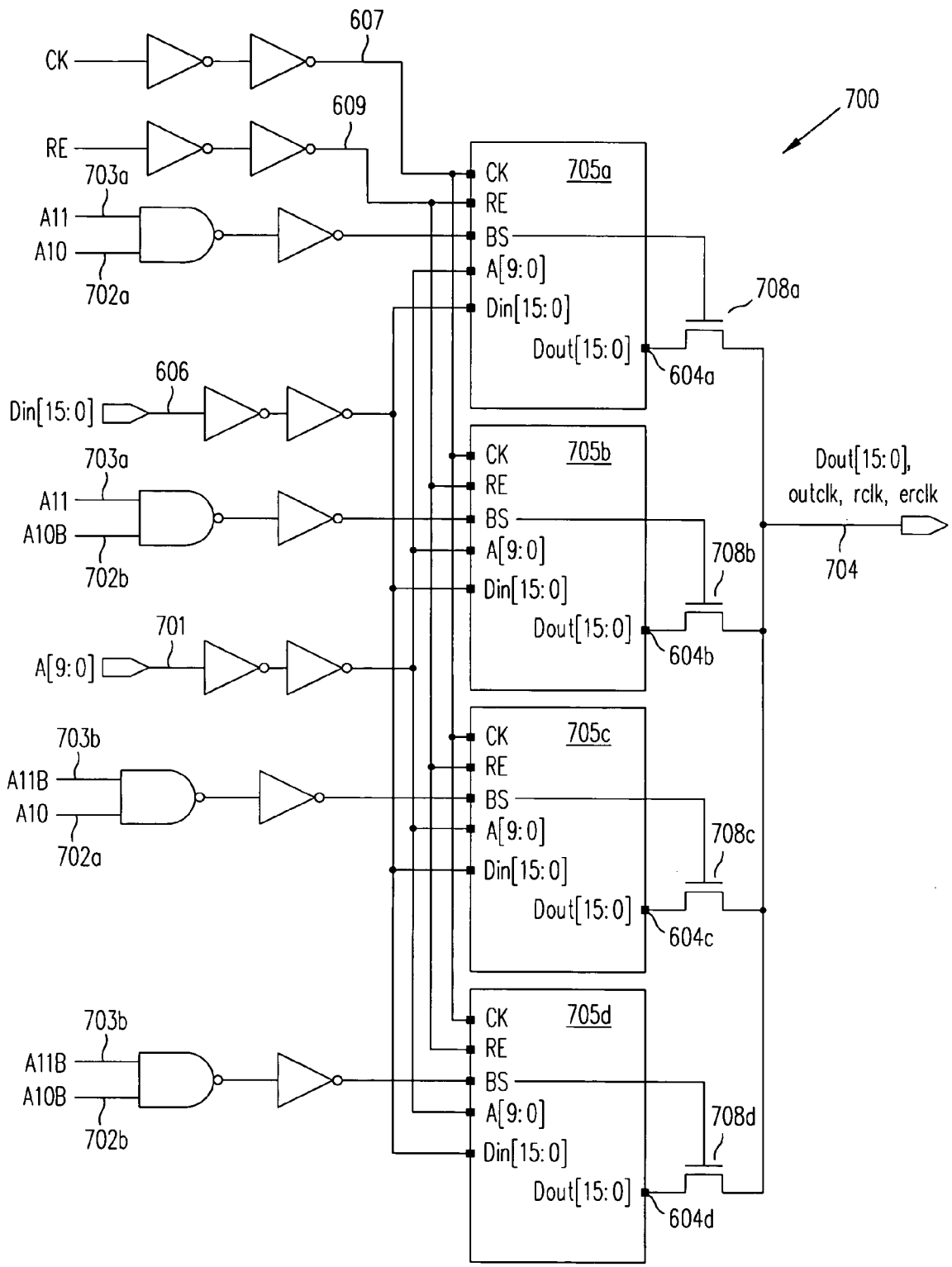
FIG. 7 illustrates 4K×16 memory block 700, which can be used to provide any of memory blocks 605a–605d of FIG. 6.
Figure 8:
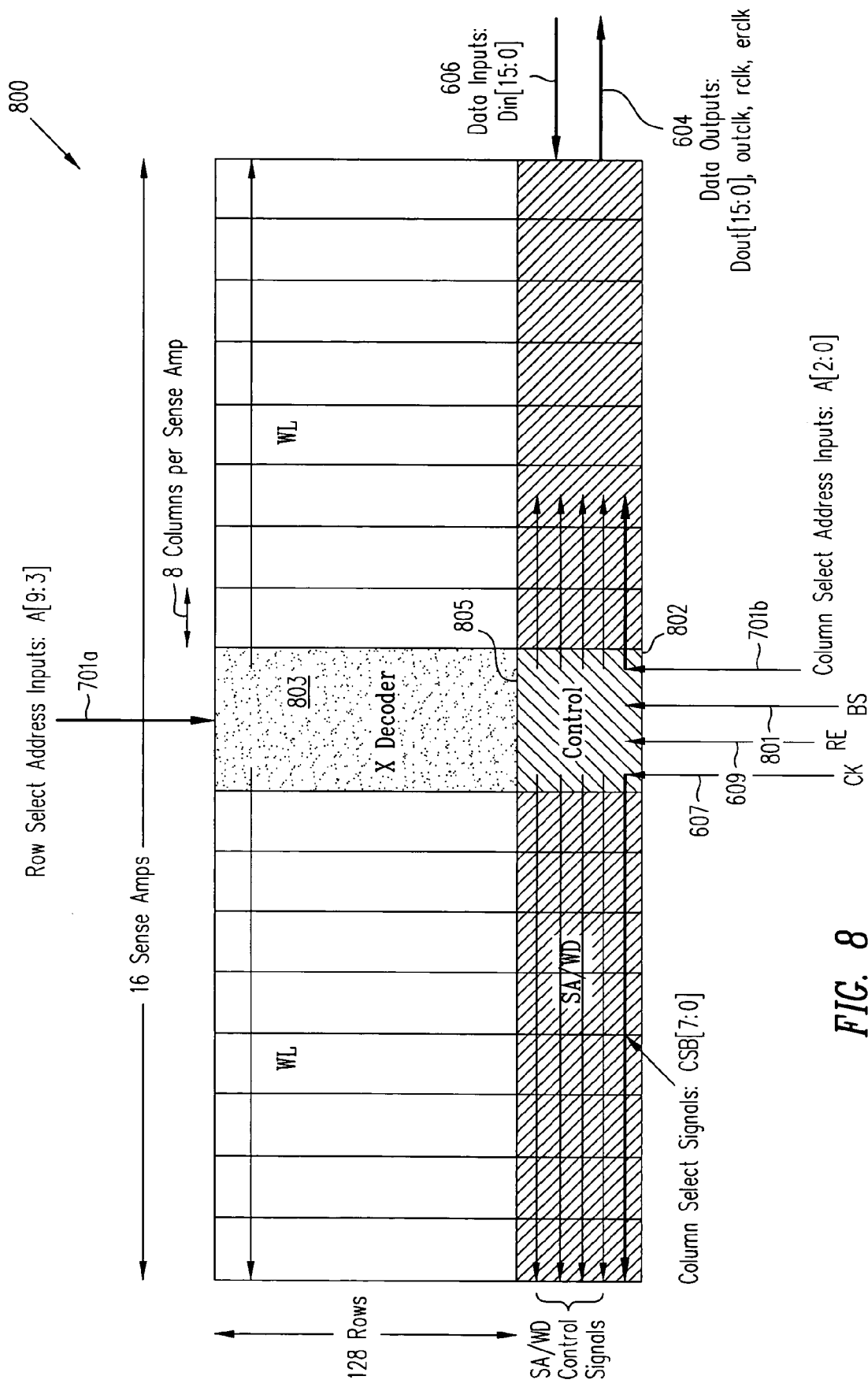
FIG. 8 illustrates 1K×16 memory block 800, which can to provide any of 1K×16 memory blocks 705a–705d of FIG. 7.

According to one embodiment of the present invention, main memory array 101 can be provided by a hierarchical organization of memory blocks. FIGS. 6–8 illustrate such an organization using as memory block 800 (FIG. 8) as a building block. FIG. 8 is a block diagram showing, for example, memory block 800 as a 1K×16 memory block organized in 128 rows and 128 columns. (In this embodiment, the columns are grouped into 16 groups, each group sharing a sense amplifier). FIG. 7 shows memory block 800 being used to provide each of four 1K×16 memory blocks 705a–705d to form 4K×16 memory block 700. In the same manner, 4K×16 memory block 700 can be used to provide each of 4K×16 memory blocks 605a–605b to form 16K×16 memory block 600. Memory block 600 can be used to provide main memory array 101 of FIG. 1, in accordance with one embodiment of the present invention as discussed above. Of course, depending on the size desired of main memory array 101, more or less levels of hierarchy can be provided than the three levels exemplified herein to construct the desired main memory array. Memory block 800 can also be used as a redundant block, such as any of redundant blocks 121–124 of FIG. 1.

As shown in FIG. 6, memory block 600, which includes four component memory blocks 605a–605d (each holding 4K 16-bit words), receives a 14-bit address at terminals and a 16bit data word on bus 606, and provides as output a 16-bit data word on bus 604. (Of course, the sizes of the memory blocks provided herein are merely illustrative; in any implementation, any size may be provided in accordance with the principles discussed herein). The address received includes twelve address signals (A[11:0]) and their logical complements on bus 601, and address signals A[12] and A[13] and their logical complements at terminals 602a, 602b, 603a and 603b, respectively. In memory block 600, the 12-bit address on bus 601 (i.e., address signals A[11:0]) are decoded within each of component memory blocks 605a–605d, while the four bits derived from address signals A[12:11] and their logical components (i.e., the signals at terminals 602a, 602b, 603a and 603b) are ANDed in pairs to assert one of four block select ("BS") signals to select one of component blocks 605a–605d. The BS signal for each component memory block, when asserted, renders the corresponding one of transistor groups 608a–608d conducting, thereby allowing the 16-bit output data word and the associated control signals (e.g., signal outclk at terminal 109, signal rclk at terminal 110, and signal erclk at terminal 111) of the selected component memory block to be placed on output data bus 604. Component memory block 605a–605d each also receives clock signal CK at terminal 607 and read/write control signal RE at terminal 609.

Component memory blocks 605a–605d can each be implemented, for example, by memory block 700 of FIG. 7. As shown in FIG. 7, memory block 700, which includes four component memory blocks 705a–705d (each holding 1K 16-bit words), receives a 10-bit address at terminals 701 and a 16-bit data word on bus 606, and provides as output a 16-bit data word on bus 604. The address received includes ten address signals (A[9:0]) and their logical complements on bus 701, and address signals A[10] and A[11] and their logical complements at terminals 702a, 702b, 703a and 703b, respectively. In memory block 700, the 10-bit address on bus 601 (i.e., address signals A[9:0]) are decoded within each of component memory blocks 705a–705d, while the four bits derived from address signals A[11:10] and their logical components (i.e., the signals at terminals 702a, 702b, 703a and 703b) are ANDed in pairs to assert one of four block select signals BS to select one of component blocks 605a-605d. The block select signal BS for each component memory block, when asserted, renders the corresponding one of transistor groups 708a–708d conducting, thereby allowing the 16-bit output data word and the control signals of the selected component memory block on the selected one of buses 604a–604d to be placed on output data bus 704. Component memory block 705a–705d each also receives clock signal CK at terminal 607 and read/write control signal RE at terminal 609.

Component memory blocks 705a–705d of FIG. 7 can each be implemented using a memory circuit, such as memory circuit 800 of FIG. 8. As shown in FIG. 8, memory circuit 800 includes memory array 804 of 1K (i.e., 1024) memory cells organized into 128 rows and 16 groups of 8 columns (i.e., for a total of 128 columns). Memory circuit 800 receives a 10-bit address A[9:0] on bus 701a (A[9:3]) and bus 701b (A[2:0]) for selecting one of 128 word line (WL) signals and one of 8 sets of column select ("CS") signals, respectively. In this embodiment, the column select signals are distributed equally on both sides of row decoder 803, with each set of column select signals enabling the 8 sense amplifier circuits on each side to provide 16 bits of data output (SA) from a selected memory word, or to write 16 of bits of data into the selected memory word. Control circuit 805 generates control signals outclk, rclk and erclk having the timing relationships described above with respect to FIGS. 4 and 5.

Thus, a high performance, high throughput semiconductor memory integrated circuit with redundant memory blocks is achieved.

The above detailed description is provided to illustrate the specific embodiments of the present invention and is not intended to be limiting. Numerous variations and modifications within the scope of the present invention are possible. The present invention is set forth in the claims below.

We claim:

1. A memory circuit, comprising:
   an output data bus;
   a memory array receiving a memory address and providing output data from a memory access using the memory address, the memory array comprising a plurality of memory blocks, and a control circuit providing a timing signal that is asserted at a first predetermined time earlier than a second predetermined time when the output data from the memory access is expected to be ready at the output data bus;
   a redundant memory circuit receiving the memory address and the timing signal, and providing output data when the memory address corresponds to a stored memory address in the redundant memory circuit, the output data being provided at the first predetermined time, in accordance with the timing signal; and
   a selection circuit selecting, for output at the second predetermined time on the data output bus, between the output data of the memory array and the output data of the redundant memory circuit;
   wherein the memory array provides a second timing signal which is asserted to indicate the second predetermined time.

2. A memory circuit as in claim 1, wherein the selection circuit performs the selecting according to the second timing signal.

3. A memory circuit as in claim 1, wherein the redundant memory circuit comprises a first-in-first-out (FIFO) memory that holds the output data of the redundant memory circuit.

4. A memory circuit as in claim 3, wherein the FIFO memory comprises a control circuit receiving the timing signal.

5. A memory circuit as in claim 4, wherein the control circuit of the FIFO memory comprises toggle flip-flops.

6. A memory circuit as in claim 1, wherein the redundant memory circuit comprises a plurality of memory blocks.

7. A memory circuit as in claim 1, wherein the redundant memory circuit comprises address comparators.

8. A memory circuit as in claim 1, wherein the memory array comprises a pipelined output stage.

9. A method in a memory circuit, comprising:
   receiving into a memory array a memory address for performing an access a memory block within the memory array corresponding to the memory address;
   generating, from the memory array, a timing signal that is asserted at a first predetermined time earlier than a second predetermined time when the output data from the memory access is expected to be ready at an output data bus;
   receiving into a redundant memory circuit the memory address and the timing signal;
   providing from the redundant memory circuit output data when the memory address corresponds to a stored memory address in the redundant memory circuit, the output data being provided at the first predetermined time in accordance with the timing signal;
   generating, from the memory array, a second timing signal indicating that the output data of the memory array is ready; and at the second predetermined time, selecting between the output data of the memory array and the output data of the redundant memory circuit for output on the data output bus.

10. A method as in claim 9, wherein the selecting is performed according to the second timing signal.

11. A method as in claim 9, wherein the redundant memory circuit holds the output data of the redundant memory circuit in a first-in-first-out (FIFO) memory.

12. A method as in claim 11, wherein the FIFO memory is controlled according to the timing signal.

13. A method as in claim 12, wherein the timing signal is provided to control a toggle flip-flop.

14. A method as in claim 9, wherein the redundant memory circuit comprises a plurality of memory blocks.

15. A method as in claim 9, further comprising comparing, in the redundant memory circuit, the memory address to the stored memory address using address comparators.

16. A method as in claim 9, wherein the memory array comprises a pipelined output stage.

* * * * *